(12) United States Patent
Chiu et al.

(10) Patent No.: US 6,437,984 B1
(45) Date of Patent: *Aug. 20, 2002

(54) THERMALLY ENHANCED CHIP SCALE PACKAGE

(75) Inventors: Anthony M. Chiu; Tom Quoc Lao, both of Richardson, TX (US)

(73) Assignee: STMicroelectronics, Inc., Carrollton, TX (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/656,983

(22) Filed: Sep. 7, 2000

(51) Int. Cl.[7] .............................................. H05K 7/20
(52) U.S. Cl. ........................ 361/704; 29/841; 257/796; 361/719; 438/122
(58) Field of Search ............................... 165/80.3, 185; 257/706, 707, 712, 713, 720, 724, 723, 796; 361/704, 705, 717–719, 722, 735, 790; 174/5.2, 252, 16.3; 438/121, 122, 123; 29/832, 840, 841; 264/272.14, 272.15, 275.17

(56) References Cited

U.S. PATENT DOCUMENTS

| | | | |
|---|---|---|---|
| 5,222,014 A | * | 6/1993 | Lin |
| 5,311,060 A | * | 5/1994 | Rostoker |
| 5,525,835 A | * | 6/1996 | Nishiguchi |
| 5,615,086 A | * | 3/1997 | Collins |
| 5,866,943 A | * | 2/1999 | Mertol ........................ 257/712 |
| 5,901,042 A | * | 5/1999 | Ota |
| 6,008,536 A | * | 12/1999 | Mertol ........................ 257/704 |
| 6,143,590 A | * | 11/2000 | Ohki |
| 6,146,921 A | * | 11/2000 | Barrow |
| 6,190,945 B1 | * | 2/2001 | Akram ........................ 438/122 |
| 6,201,302 B1 | * | 3/2001 | Tzu |

* cited by examiner

Primary Examiner—G P Tolin
(74) Attorney, Agent, or Firm—Lisa K. Jorgenson; Daniel E. Venglarik

(57) ABSTRACT

A heat sink is mounted on an integrated circuit die within a Chip Scale Package, without a substrate supporting the heat sink. The heat sink may be mounted on a central portion of the active surface of the integrated circuit die without impeding wire bond connection of bond pads around peripheral region of the active surface. Alternatively, the heat sink may be mounted on the backside of one integrated circuit die within a stacked configuration of integrated circuits having facing active surfaces. The required form factor for Chip Scale Packages is maintained while providing heat dissipation for high input/output devices. The heat sink may be wire bonded to a ground connection to provide the packaged integrated circuit with shielding from electrical or electromagnetic interference.

20 Claims, 2 Drawing Sheets

THERMALLY ENHANCED CHIP SCALE PACKAGE

BACKGROUND OF THE INVENTION

1. Field of the Invention

The present invention relates generally to integrated circuit packages and in particular to improving the thermal properties of integrated circuit packaging. Still more particularly, the present invention relates to including a thermal mass within an integrated circuit package for dissipating heat during operation.

2. Description of the Prior Art

The size of integrated circuit packages is shrinking while the complexity and density of electronic circuits within such packages is increasing. The processing requirements of integrated circuits may require that large amounts of power be drawn by the integrated circuits over short periods of time. The power which is drawn is generally dissipated as thermal energy (heat). Because the package size—and therefore the surface area—of integrated circuit devices is shrinking, dissipation of such heat is slowed. As the heat builds, performance of the integrated circuit may be degraded. External heat sinks or cooling fans, employed in large electronic devices such as computers, cannot be employed to dissipate heat in many contemporary electronic devices, such as wireless phones or handheld electronics devices.

Current or proposed solutions to dissipating heat within packaged integrated circuits are illustrated in FIGS. 3 and 4. In the approach of FIG. 3, a substrate 300 forms the base for an integrated circuit die 302 mounted on substrate 300 using a thin epoxy 304 and connected to substrate 300 by wire bonds 306. A thick layer 308 of epoxy resin or plastic overlies the integrated circuit die 302 and wire bonds 306, over which is placed a preformed pyramidal heat slug 310. An additional plastic or epoxy material 312 is formed over the heat slug 310. With the approach illustrated in FIG. 3, a distance between the integrated circuit die 302 and the heat slug 310, as well as the intervening epoxy or plastic 308 which act as a thermal insulator, constrains the ability of the heat slug 310 to dissipate heat generated by the integrated circuit die 302.

The alternative approach of FIG. 4 employs a substrate 402 supporting a heat sink 404 which contacts the integrated circuit die 406. Bond wires 408 connect the integrated circuit die 406 to conductive traces one the substrate 402, which are connected in turn to solder balls providing contact to other conductive structures on a printed circuit board or the like. The substrate 402, heat sink 404, and integrated circuit die 406 are then encapsulated by a plastic or epoxy packaging material 410. While this approach eliminates the distance and thick insulator between the heat sink 404 and the integrated circuit die 406, input/output is constrained by the inability to place solder ball connections beneath the integrated circuit die 406, limiting the number of input/output connections which may be made to the integrated circuit without also increasing the area (or "footprint") of the integrated circuit. Additionally, the use of a separate substrate 402 to support heat sink 406 increases the package thickness.

The small form factor required for integrated circuit packages in wireless phones, handheld personal digital assistants, and the like preclude the use of spaced heat sinks and/or separate substrates supporting the heat sink. Chip Scale Packages (CSPs), characterized by small footprint, thin form factor (1.2 to 1.4 mm total thickness) and high input/output (I/O) capacity, exemplify such integrated circuits.

It would be desirable, therefore, to provide effective heat dissipation within small form factor integrated circuits without reducing I/O capacity.

SUMMARY OF THE INVENTION

A heat sink is mounted on an integrated circuit die within a Chip Scale Package, without a substrate supporting the heat sink. The heat sink may be mounted on a central portion of the active surface of the integrated circuit die without impeding wire bond connection of bond pads around peripheral region of the active surface. Alternatively, the heat sink may be mounted on the backside of one integrated circuit die within a stacked configuration of integrated circuits having facing active surfaces. The required form factor for Chip Scale Packages is maintained while providing heat dissipation for high input/output devices. The heat sink may be wire bonded to a ground connection to provide the packaged integrated circuit with shielding from electrical or electromagnetic interference.

BRIEF DESCRIPTION OF THE DRAWINGS

The novel features believed characteristic of the invention are set forth in the appended claims. The invention itself however, as well as a preferred mode of use, and further objects and advantages thereof, will best be understood by reference to the following detailed description of an illustrative embodiment when read in conjunction with the accompanying drawings, wherein:

DETAILED DESCRIPTION

The following description details the structure, application and features of the present invention, but it will be understood by those of skill in the art that the scope of the invention is defined only by the issued claims, and not by any description herein. The process steps and structures described below do not form a complete process flow for manufacturing integrated circuit packages. The present invention may be practiced in conjunction with common integrated circuit package fabrication techniques, and only so much of the commonly practiced process steps are included as are necessary for an understanding of the present invention. The figures representing cross-sections of portions of an integrated circuit package during fabrication are not drawn to scale, but instead are drawn so as to illustrate the important features of the invention.

Figure 1A:
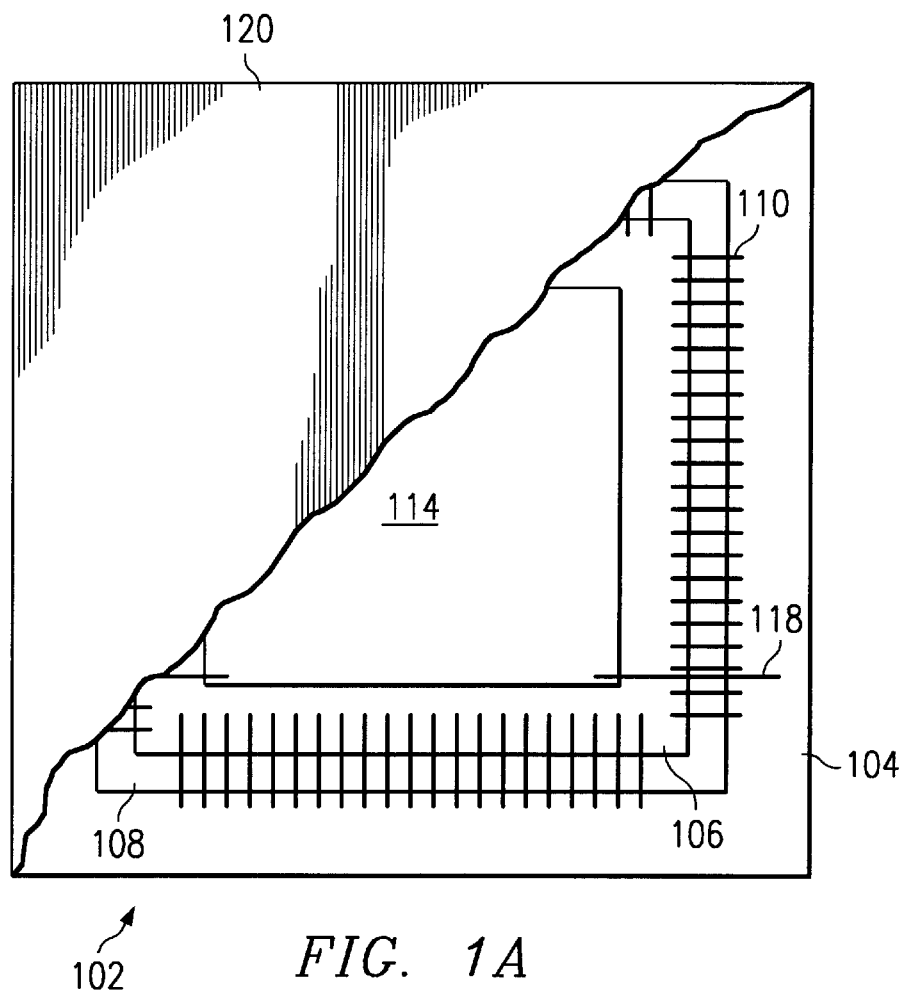
FIGS. 1A–1B depict various views of a Chip Scale Package with a he sink in accordance with a preferred embodiment of the present invention.
Figure 1B:
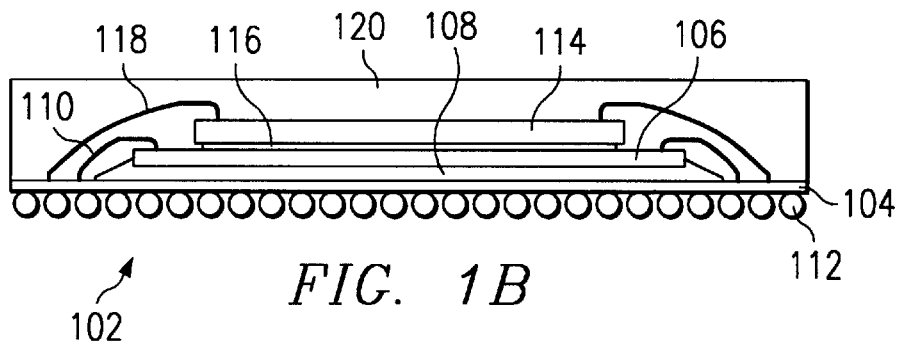

With reference now to the figures, and in particular with reference to FIGS. 1A and 1B, various views of a Chip Scale Package with a heat sink in accordance with a preferred embodiment of the present invention is depicted. FIG. 1A depicts a break-away plan view of the Chip Scale Package, while FIG. 1B depicts a cross-sectional view. Chip Scale Package 102 includes a thin tape or rigid mounting substrate 104 containing conductive traces (not shown). An integrated circuit die 106 is affixed to tape or substrate 104 by a thin adhesive layer 108.

Wire bonds 110 electrically connect bonds pads around a peripheral portion of the active surface (the surface on which devices are formed) of the integrated circuit die 106 to the conductive traces on the tape or substrate 104. The conductive traces on the tape or substrate 104 are also connected to solder balls 112 on the bottom of tape or substrate 104, where solder balls 112 form a ball grid array providing contacts to other conductive structures on a printed circuit board or similar structure.

In the present invention, a heat sink 114 is mounted directly on the active surface of the integrated circuit die 106, on a central region of the active surface not including any bond pads. Heat sink 114 is affixed to the active surface of integrated circuit die 106 by a thin adhesive layer 116, such as epoxy. Heat sink 114 is metal of the same type utilized for internal heat sinks in other designs, with a thickness allowing Chip Scale Package 102 to remain within the standard sizes for small form factor packages (1.2 to 1.4 mm total thickness, including solder balls.) "Stacked Chip Scale packages, which contain multiple die, one on top of another, within the Chip Scale Package, have been produced. Therefore, heat sink 114 may be mounted on the active surface of an integrated circuit die in place of another integrated circuit die or, as shown below, in addition to another integrated circuit die.

The metal heat sink 114 on top of integrated circuit die 106 reduces the junction-to-packaging temperature, and also increases the thermal coefficient of expansion for Chip Scale Package 102, making the package more compatible with the substrate material upon which the package is mounted. In the example shown, heat sink 114 is also connected by wire bonds 118 to one or more conductive traces on tape or substrate 104, providing a ground connection for heat sink 114. When grounded, heat sink 114 provides shielding for integrated circuit die 106 against electrical or electromagnetic interference. Integrated circuit die 106, heat sink 114, and wire bonds 110 and 118 are all encapsulated in a plastic or epoxy material 120.

Figure 2:
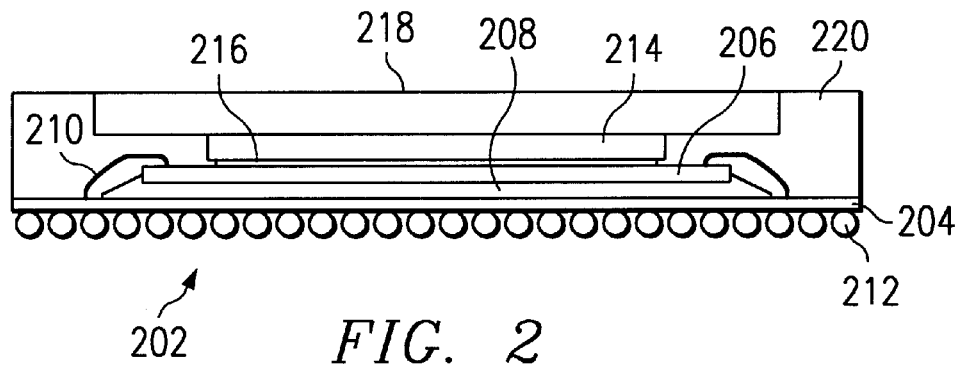
FIG. 2 is cross-sectional view of an alternative implementation of a Chip Scale Package with a heat sink in accordance with a preferred embodiment of the present invention.
Figure 3:
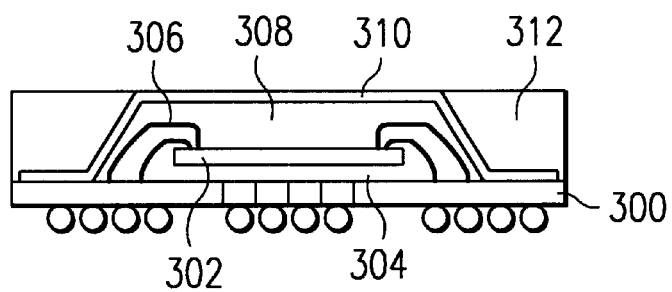
FIGS. 3 and 4 depict existing approaches to dissipating heat within integrated circuit packaging.
Figure 4:
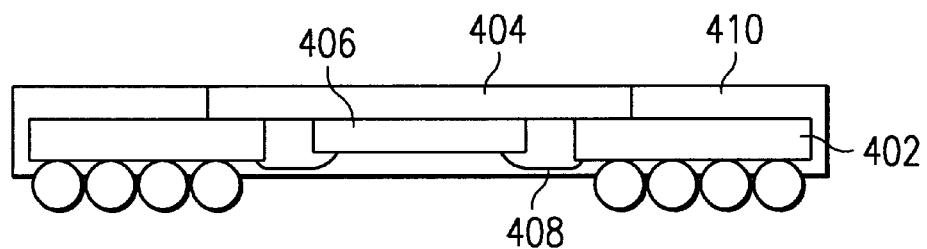

Referring to FIG. 2, a cross-sectional view of an alternative implementation of a Chip Scale Package with a heat sink in accordance with a preferred embodiment of the present invention is illustrated. Chip Scale Package 202 includes a thin tape or rigid mounting substrate 204 to which an integrated circuit die 206 is affixed by a thin adhesive layer 208. Wire bonds 210 connect bonds pads around a peripheral region of the active surface of integrated circuit die 206 to conductive traces on tape or substrate 204, which are also connected to solder balls 212 on the opposite side of tape or substrate 204 from integrated circuit die 206.

A second integrated circuit die 214 is mounted on top of integrated circuit die 206 in a "stacked" chip configuration. Integrated circuit die 214 is mounted on a central portion of the active surface of integrated circuit die 206, and is mounted with the active surface of integrated circuit die 214 facing the active surface of integrated circuit die 206. Solder balls or other conductive structures (not shown) connect contacts on the active surface of integrated circuit die 214 to corresponding contacts on the active surface of integrated circuit die 206 through the electrically conductive layer 216 affixing integrated circuit die 214 to integrated circuit die 206.

A metal heat sink 218 is placed on integrated circuit die 214, held in place by plastic or epoxy material 220 encapsulating integrated circuit 206, integrated circuit 214, and wire bonds 210. Due to size constraints for Chip Scale Package 202, a surface of heat sink 218 opposite integrated circuit die 214 is exposed and required for better thermal dissipation.

In the present invention, a heat sink is placed in direct contact with an integrated circuit die within the packaged integrated circuit. Although described in the context of Chip Scale Packages having a small form factor, a heat sink may be employed in accordance with the present invention in other packages as well.

While the invention has been particularly shown and described with reference to a preferred embodiment, it will be understood by those skilled in the art that various changes in form and detail may be made therein without departing from the spirit and scope of the invention.

What is claimed is:

1. A method of packaging an integrated circuit, comprising:

mounting an integrated circuit die on a mounting member, wherein wire bonds connect bonds pads in a peripheral upper surface of the integrated circuit die to conductive traces on the mounting member;

affixing a heat sink to a central portion of the upper surface of the integrated circuit die; and encapsulating the integrated circuit die, at least a portion of the heat sink, and the wire bonds with a plastic or epoxy material to form a Chip Scale Package having an array of solder balls on a bottom thereof and having a total thickness, including the solder balls, of less than 1.4 mm.

2. The method of claim 1, further comprising:

connecting the heat sink to a conductive trace on the mounting member to provide a ground connection to the heat sink.

3. The method of claim 1, wherein the step of affixing a heat sink to a central portion of the active surface of the integrated circuit die further comprises:

affixing a heat sink having a length dimension less than a distance between bond pads on opposite sides of the integrated circuit die to the central portion of the active surface of the integrated circuit die.

4. The method of claim 1, wherein the step of affixing a heat sink to a central portion of the upper surface of the integrated circuit die further comprises:

affixing a metal heat sink to the central portion of the active surface of the integrated circuit die.

5. The method of claim 1, wherein the heat sink is positioned in lieu of a second integrated circuit die for a stacked Chip Scale Package.

6. A method of packaging an integrated circuit, comprising:

mounting a first integrated circuit die on a mounting member, wherein wire bonds connect bonds pads in a peripheral upper surface of the first integrated circuit die to conductive traces on the mounting member;

mounting a second integrated circuit die on the first integrated circuit die within a region on the upper surface of the first integrated circuit die not including any bond pads;

affixing a heat sink to the second integrated circuit die; and encapsulating the first and second integrated circuit die, at least a portion of the heat sink, and the wire bonds with a plastic or epoxy material to form a Chip Scale Package having an array of solder balls on a bottom thereof and having a total thickness, including the solder balls, of less than 1.4 mm.

7. The method of claim 6, wherein the step of encapsulating the first and second integrated circuit die, the heat sink, and the wire bonds with a plastic or epoxy material to form a Chip Scale Package further comprises:

leaving a surface of the heat sink opposite the second integrated circuit die exposed.

8. An integrated circuit package, comprising:

an integrated circuit die on a mounting member and including bonds pads in a peripheral upper surface of the integrated circuit die connected to conductive traces on the mounting member by wire bonds;

a heat sink affixed to a central portion of the upper surface of the integrated circuit die between bond pads on opposite sides of the integrated circuit die; and a plastic or epoxy material encapsulating the integrated circuit die, at least a portion of the heat sink, and the wire bonds to form a Chip Scale Package having an array of solder balls on a bottom thereof and having a total thickness, including the solder balls, of less than 1.4 mm.

9. The integrated circuit package of claim 8, wherein the heat sink is connected by a wire bond to a conductive trace on the mounting member to provide a ground connection for the heat sink.

10. The integrated circuit package of claim 8, wherein the heat sink has a length dimension less than a distance between bond pads on opposite sides of the integrated circuit die.

11. The integrated circuit package of claim 8, wherein the heat sink is metal.

12. The integrated circuit package of claim 8, wherein the heat sink is positioned in lieu of a second integrated circuit die for a stacked Chip Scale Package.

13. An integrated circuit package, comprising:

a first integrated circuit die on a mounting member and including bonds pads in a peripheral upper surface of the first integrated circuit die connected by bond wires to conductive traces on the mounting member;

a second integrated circuit die mounted on the first integrated circuit die within a region on the upper surface of the first integrated circuit die not including any bond pads;

a heat sink affixed to the second integrated circuit die; and a plastic or epoxy material encapsulating the first and second integrated circuit die, at least a portion of the heat sink, and the wire bonds to form a Chip Scale Package having an array of solder balls on a bottom thereof and having a total thickness, including the solder balls, of less than 1.4 mm.

14. The integrated circuit package of claim 13, wherein a surface of the heat sink opposite the second integrated circuit die is left exposed by the plastic or epoxy material.

15. The method of claim 1, wherein the total thickness is between 1.2 and 1.4 mm.

16. The method of claim 1, wherein the step of encapsulating the integrated circuit die, at least a portion of the heat sink, and the wire bonds with a plastic or epoxy material to form a Chip Scale Package having an array of solder balls on a bottom thereof and having a total thickness, including the solder balls, of less than 1.4 mm further comprises:

leaving a surface of the heat sink opposite the integrated circuit die exposed.

17. The integrated circuit package of claim 8, wherein the total thickness is between 1.2 and 1.4 mm.

18. The integrated circuit package of claim 8, wherein a surface of the heat sink opposite the integrated circuit die exposed.

19. The method of claim 1, wherein the heat sink has a length and a width each smaller than a distance between bond pads on corresponding opposite sides of the integrated circuit die.

20. The integrated circuit package of claim 8, wherein the heat sink has a length and a width each smaller than a distance between bond pads on corresponding opposite sides of the integrated circuit die.

* * * * *